United States Patent
Arai et al.

(10) Patent No.: US 6,236,235 B1
(45) Date of Patent: May 22, 2001

(54) OUTPUT CIRCUIT

(75) Inventors: Katsuya Arai, Kyoto (JP); Shoichi Yoshizaki, Sunnyvale, CA (US)

(73) Assignee: Matsushita Electric Industrial Co., LTD (JP)

( * ) Notice: Subject to any disclaimer, the term of this patent is extended or adjusted under 35 U.S.C. 154(b) by 0 days.

(21) Appl. No.: 09/249,517

(22) Filed: Feb. 12, 1999

(30) Foreign Application Priority Data

Feb. 13, 1998 (JP) ................................................. 10-030995

(51) Int. Cl.[7] ............................................. H03K 19/0175
(52) U.S. Cl. ................................. 326/81; 326/57; 326/83
(58) Field of Search ................................ 326/57, 58, 81, 326/83

(56) References Cited

U.S. PATENT DOCUMENTS 5,555,149   9/1996  Wert et al. .
5,933,025 * 8/1999  Nance et al. ............................ 326/81
5,963,055 * 10/1999 Tanaka et al. ........................... 326/81

* cited by examiner

*Primary Examiner*—Patrick Wamsley
*Assistant Examiner*—Anh Tran
(74) *Attorney, Agent, or Firm*—Harness, Dickey & Pierce, P.L.C.

(57) ABSTRACT

In an output circuit having an input/output terminal, first and second p-channel MOS transistors are serially connected between a power supply and the input/output terminal. An enable signal and an input signal are supplied to an NAND circuit. The gate of the second p-channel MOS transistor is controlled using the output signal of the NAND circuit, thereby outputting a signal through the input/output terminal. If a voltage of a signal received at the input/output terminal exceeds the power supply voltage, a gate controller turns OFF the first p-channel MOS transistor. Accordingly, even if a signal with a voltage higher than the power supply voltage is received at the input/output terminal, the input signal can be output through the input/output terminal with a reduced delay and without generating unnecessary current inside the output circuit or causing any breakdown in a gate oxide film.

12 Claims, 4 Drawing Sheets

Prior Art

OUTPUT CIRCUIT

BACKGROUND OF THE INVENTION

The present invention relates to an interface for a semiconductor integrated circuit.

In recent years, as the number of semiconductor large-scale integrated circuits (hereinafter, simply referred to as "LSI's"), integrated on a single chip, and the operating speed thereof have been tremendously increased, the power dissipation has also increased noticeably. In order to suppress such increase in power consumption, LSI's are often operated with a reduced power supply voltage. However, it is not always possible to operate all LSI's, included in a single circuit, with an equally reduced power supply voltage. If not, interfacing an LSI operating at a relatively high power supply voltage (e.g., 5 V) with another LSI operating at a relatively low power supply voltage (e.g., 3.3 V) plays an important role in suppressing such unwanted increase in power consumed. Nevertheless, connection of an input/output terminal of an LSI operating at a relatively high voltage like 5 V to that of another LSI operating at a relatively low voltage like 3.3 V causes the following two problems.

First, if the LSI operating at 3.3 V receives a voltage (e.g., 5 V) higher than the power supply voltage thereof (i.e., 3.3 V), then a p-channel MOS transistor, implemented as an output circuit section of an input/output circuit, turns ON. In such a case, current is unintentionally passed from an input/output terminal through the p-channel MOS transistor into a power line inside the LSI. Since the input/output terminal should have high impedance during input operation, such unwanted current supply increases power consumption unnecessarily.

Second, the gate oxide film of an MOS transistor inside the LSI operating at 3.3 V often has a breakdown voltage no higher than the power supply voltage thereof (i.e., 3.3 V). Accordingly, if a high voltage such as 5 V is applied to the film, then dielectric breakdown happens in the MOS transistor, because the applied voltage exceeds the breakdown voltage of the gate oxide film.

Means for solving these problems are disclosed, for example, in U.S. Pat. No. 5,555,149.

Hereinafter, the prior art input/output circuit described in the above-identified patent will be described with reference to the accompanying drawings. It should be noted that the input/output circuit can solve these two problems.

FIG. 3 illustrates the configuration of the prior art input/output circuit.

As shown in FIG. 3, the input/output circuit includes: an input/output terminal IO; an input terminal IN; an output terminal OUT; an enable terminal EN; an output circuit 1; and an input circuit 2. The input/output terminal IO is used for exchanging signals with external circuits outside of an LSI. At the input terminal IN, signals are received from other circuits inside the LSI. Conversely, through the output terminal OUT, signals are output to other circuits inside the LSI. And the enable terminal EN is used for switching the output/input states of the input/output terminal IO.

In the output circuit 1, if the enable terminal EN is at a high, or "H", level, a signal, received at the input terminal IN, is output through the input/output terminal IO. Alternatively, if the enable terminal EN is at a low, or "L", level, the input/output terminal IO comes to have high impedance.

The output circuit 1 further includes: p-channel MOS (PMOS) transistors 11, 12 and 13; n-channel MOS (NMOS) transistors 14, 15, 16 and 17; an inverter 18; a NAND circuit 19; a NOR circuit 20; a power supply terminal 21; and a ground terminal 22. The PMOS transistors 11 and 12 are serially connected between the power supply terminal 21 and the input/output terminal IO. The NMOS transistors 14 and 15 are serially connected between the input/output terminal IO and the ground terminal 22.

The output of the NAND circuit 19 is supplied to the gate of the PMOS transistor 11, to the gate of the PMOS transistor 12 through the serially connected NMOS transistors 17 and 16, and to the gate of the NMOS transistor 17 via the inverter 18. One of the input terminals of the NAND circuit 19 is connected to the enable terminal EN, while the other terminal thereof is connected to the input terminal IN. The input/output terminal IO and the gate of the PMOS transistor 12 are connected to each other via the PMOS transistor 13. The respective gates of the PMOS and NMOS transistors 13, 14 and 16 are connected to the power supply terminal 21.

The output of the NOR circuit 20 is supplied to the gate of the NMOS transistor 15. One of the input terminals of the NOR circuit 20 receives an inverted signal of the signal received at the enable terminal EN, while the other terminal thereof is connected to the input terminal IN.

The input circuit 2 receives a signal supplied from the input/output terminal IO and outputs the signal through the output terminal OUT to other circuits inside the LSI.

The operation of the input/output circuit having such a configuration will be described in terms of the operation of outputting a signal, supplied from internal circuits in the output circuit 1, through the input/output terminal IO, in particular.

In outputting a signal through the input/output terminal IO, the enable terminal EN should be at "H" level.

First, the operation of outputting an "H" level signal, received at the input terminal IN, through the input/output terminal IO will be described. In this case, the respective outputs of the NAND and NOR circuits 19 and 20 are both at "L" level. Since the respective gates of the PMOS and NMOS transistors 13, 14 and 16 are connected to the power supply terminal 21, an "H" level signal is always supplied to these gates. Accordingly, the PMOS transistor 13 turns OFF, while the NMOS transistors 14 and 16 turn ON. In response to the "L" level signal supplied from the NAND circuit 19, the inverter 18 outputs an "H" level signal, thereby turning the NMOS transistor 17 ON. In this case, the respective gates of the PMOS and NMOS transistors 11, 12 and 15 are all at "L" level. Accordingly, the PMOS transistors 11 and 12 turn ON, while the NMOS transistor 15 turns OFF. As a result, the "H" level signal, supplied from the power supply terminal 21, is output through the input/output terminal IO via the PMOS transistors 11 and 12.

Next, the operation of outputting an "L" level signal, received at the input terminal IN, through the input/output terminal IO will be described. In this case, the respective outputs of the NAND and NOR circuits 19 and 20 are both at "H" level. Since the respective gates of the PMOS and NMOS transistors 13, 14 and 16 are connected to the power supply terminal 21, an "H" level signal is always supplied to these gates. Accordingly, the PMOS transistor 13 turns OFF, while the NMOS transistors 14 and 16 turn ON. In response to the "H"0 level signal supplied from the NAND circuit 19, the inverter 18 outputs an "L" level signal, thereby turning the NMOS transistor 17 OFF. In this case, since the "H" level signal is supplied to the gate of the PMOS transistor 13 to turn the transistor 13 OFF, the gate voltage at the PMOS transistor 12 is indefinite. Also, since the respective gates of the PMOS and NMOS transistors 11 and 15 are both at "H" level, the PMOS transistor 11 turns OFF, while the NMOS transistor 15 turns ON. Similarly, the NMOS transistor 14 has also received the "H" level signal at the gate thereof and is ON. As a result, the "L" level signal, supplied from the ground terminal 22, is output through the input/output terminal IO via the NMOS transistors 15 and 14.

Although the state of the PMOS transistor 12 is indefinite, no current flows from the power supply terminal 21 to the input/output terminal IO, because the PMOS transistor 11, serially connected to this transistor 12, is OFF.

Next, the operation of inputting a signal, received at the input/output terminal IO, to other internal circuits inside the LSI will be described.

In inputting the signal, received at the input/output terminal IO, to other internal circuits, the enable terminal EN should be at "L" level. In such a case, the output circuit 1 has high impedance with respect to the input/output terminal IO. Hereinafter, the operation of the output circuit 1 in the high-impedance state will be described.

If the enable terminal EN is at "L" level, then the output of the NAND circuit 19 is at "H" level, while the output of the NOR circuit 20 is at "L" level. The "H" and "L" level signals are supplied to the gates of the PMOS and NMOS transistors 11 and 15, respectively. As a result, these transistors 11 and 15 both turn OFF. Accordingly, no current path is available from the input/output terminal IO. In other words, if the PMOS and NMOS transistors 11 and 15 are OFF, there is no current path connecting the power supply or ground terminal 21 or 22 to the input/output terminal IO. In such a case, the output circuit 1 has high impedance.

If a signal is received at the input/output terminal IO in such a state, then the signal is passed through the input circuit 2 and output through the output terminal OUT to other internal circuits.

Hereinafter, it will be described how the output circuit 1 operates if a voltage, higher than a power supply voltage, is applied through the input/output terminal IO. In the following example, the power supply voltage at the power supply terminal 21 is supposed to be 3.3 V and a voltage (e.g.,5 V), higher than the power supply voltage, is supposed to be applied through the input/output terminal IO.

Since a voltage at one terminal (i.e., 5 V) of the PMOS transistor 13 is higher than the gate voltage thereof (i.e., 3.3 V), the PMOS transistor 13 turns ON. And the input signal (5 V), received at the input/output terminal IO, is transmitted to the gate of the PMOS transistor 12. In response to this signal, the gate voltage of the PMOS transistor 12 increases to 5 V, and the PMOS transistor 12 turns OFF. Accordingly, the current path from the input/output terminal IO to the power supply terminal 21 is blocked.

The signal (5 V), received at the input/output terminal IO, is also transmitted to the NMOS transistor 16. However, since the gate voltage (3.3 V) at the NMOS transistor 16 is equal to or lower than the voltage (5 V) at one terminal thereof or the voltage (3.3 V) at the other terminal thereof, the NMOS transistor 16 turns OFF. Accordingly, the input signal (5 V), transmitted from the input/output terminal IO through the PMOS transistor 13 to the NMOS transistor 16, is not passed to the NMOS transistor 17.

Moreover, since the NMOS transistor 15 is also OFF, no current flows from the input/output terminal IO to the ground terminal 22, either.

Furthermore, although 5 V is applied to one terminal of the NMOS transistor 14 and one terminal of the NMOS transistor 16, only a potential difference between 5 and 3.3 V, i.e., 1.7 V, is applied to the gate oxide film thereof, because the gate voltage thereof is 3.3 V. Accordingly, no breakdown happens in the gate oxide film. Similarly, although 5 V is applied to both terminals of the PMOS transistor 13, only a potential difference between 5 and 3.3 V, i.e., 1.7 V, is applied to the gate oxide film thereof, because the gate voltage thereof is also 3.3 V. Thus, no breakdown happens in the gate oxide film, either. Although 5 V is applied to the gate of the PMOS transistor 12, the voltage at the gate oxide film thereof is also 1.7 V, because one terminal of the PMOS transistor 12 receives 5 V and the other terminal thereof receives 3.3 V. The voltage at the other terminal of the NMOS transistor 14 is a voltage obtained by subtracting the threshold voltage of the NMOS transistor 14 (defined at 1 V considering back bias effect) from the gate voltage thereof (3.3 V), i.e., 2.3 V. Thus, this voltage does not have harmful effect on the NMOS transistor 15.

In the output circuit 1 of this input/output circuit shown in FIG. 3, to output the "H" level signal, received at the input terminal IN, through the input/output terminal IO, the signal has to pass through NAND circuit 19, inverter 18, NMOS and PMOS transistors 17, 16 and 12 and terminal IO. Accordingly, a very long delay is involved between the input of the signal to the input terminal IN and the output thereof from the input/output terminal IO.

In the context of semiconductor integrated circuit technology, a power supply voltage is reduced for the purpose of suppressing increase in power dissipation when a greater number of LSI's are integrated or when the operating speed of each LSI is increased. Accordingly, such a prolonged delay is contrary to this very purpose and therefore unacceptable.

In addition, the NAND circuit 19 should drive the inverter 18, NMOS transistors 17 and 16 and PMOS transistors 11, 12 and 13. If these inverter and transistors are to be driven at a higher speed, then the size of the transistor constituting the NAND circuit 19 should be increased, which is contradictory to the missions of increasing the number of LSI's integrated and reducing power consumption.

SUMMARY OF THE INVENTION

An object of the present invention is providing an output circuit that can output a signal with a reduced delay and without generating unnecessary current or unwanted breakdown in a gate oxide film even if the circuit receives a signal with a voltage higher than a power supply voltage.

To achieve this object, the output circuit of the present invention includes: an input/output terminal; a first p-channel MOS transistor, one terminal of which is connected to the input/output terminal; a second p-channel MOS transistor serially connected to the other terminal of the first p-channel MOS transistor; and a gate controller, connected to the input/output terminal, for controlling a gate voltage of the first p-channel MOS transistor. A signal is input to the gate of the second p-channel MOS transistor, and a signal is output through the input/output terminal in response to the input signal.

In one embodiment of the present invention, during out-put enabling, the gate controller turns ON the first p-channel MOS transistor by setting a gate voltage at the first p-channel MOS transistor lower than a power supply voltage. On the other hand, during output disabling, the gate controller turns OFF the first p-channel MOS transistor by connecting the gate of the first p-channel MOS transistor to the input/output terminal if a voltage applied to the input/output terminal is higher than the power supply voltage.

In another embodiment of the present invention, the gate controller includes a third p-channel MOS transistor and a first n-channel MOS transistor. One terminal of the third p-channel MOS transistor is connected to the input/output terminal, the other terminal of the third p-channel MOS transistor is connected to the gate of the first p-channel MOS transistor, and a gate voltage at the third p-channel MOS transistor is a power supply voltage. One terminal of the first n-channel MOS transistor is connected to the gate of the first p-channel MOS transistor, a voltage at the other terminal of the first n-channel MOS transistor is equal to or lower than a ground voltage or the power supply voltage, and an enable signal is input to the gate of the first n-channel MOS transistor.

In still another embodiment, if a voltage at the input/output terminal is equal to or lower than the power supply voltage, the gate controller turns ON the first p-channel MOS transistor by setting a gate voltage at the first p-channel MOS transistor lower than a power supply voltage. Alternatively, if the voltage at the input/output terminal is higher than the power supply voltage, the gate controller turns OFF the first p-channel MOS transistor by connecting the gate of the first p-channel MOS transistor to the input/output terminal.

In still another embodiment, the gate controller includes third and fourth p-channel MOS transistors and first and second n-channel MOS transistors. One terminal of the third p-channel MOS transistor, one terminal of the first n-channel MOS transistor and the gate of the second n-channel MOS transistor are connected to the gate of the first p-channel MOS transistor. One terminal of the fourth p-channel MOS transistor is connected to the gate of the first n-channel MOS transistor and one terminal of the second n-channel MOS transistor, and a voltage at the other terminal of the fourth p-channel MOS transistor is the power supply voltage. A gate voltage at the third p-channel MOS transistor is the power supply voltage, one terminal of the third p-channel MOS transistor is connected to the gate of the fourth p-channel MOS transistor, and the other terminal of the third p-channel MOS transistor is connected to the input/output terminal.

Even if a signal with a voltage higher than a power supply voltage is input to the output circuit having such a configuration, the output circuit can output a signal with a reduced delay and without generating unnecessary current or unwanted breakdown in a gate oxide film.

DESCRIPTION OF THE PREFERRED EMBODIMENTS

Hereinafter, preferred embodiments of the present invention will be described with reference to the accompanying drawings.

Embodiment 1

Figure 1:
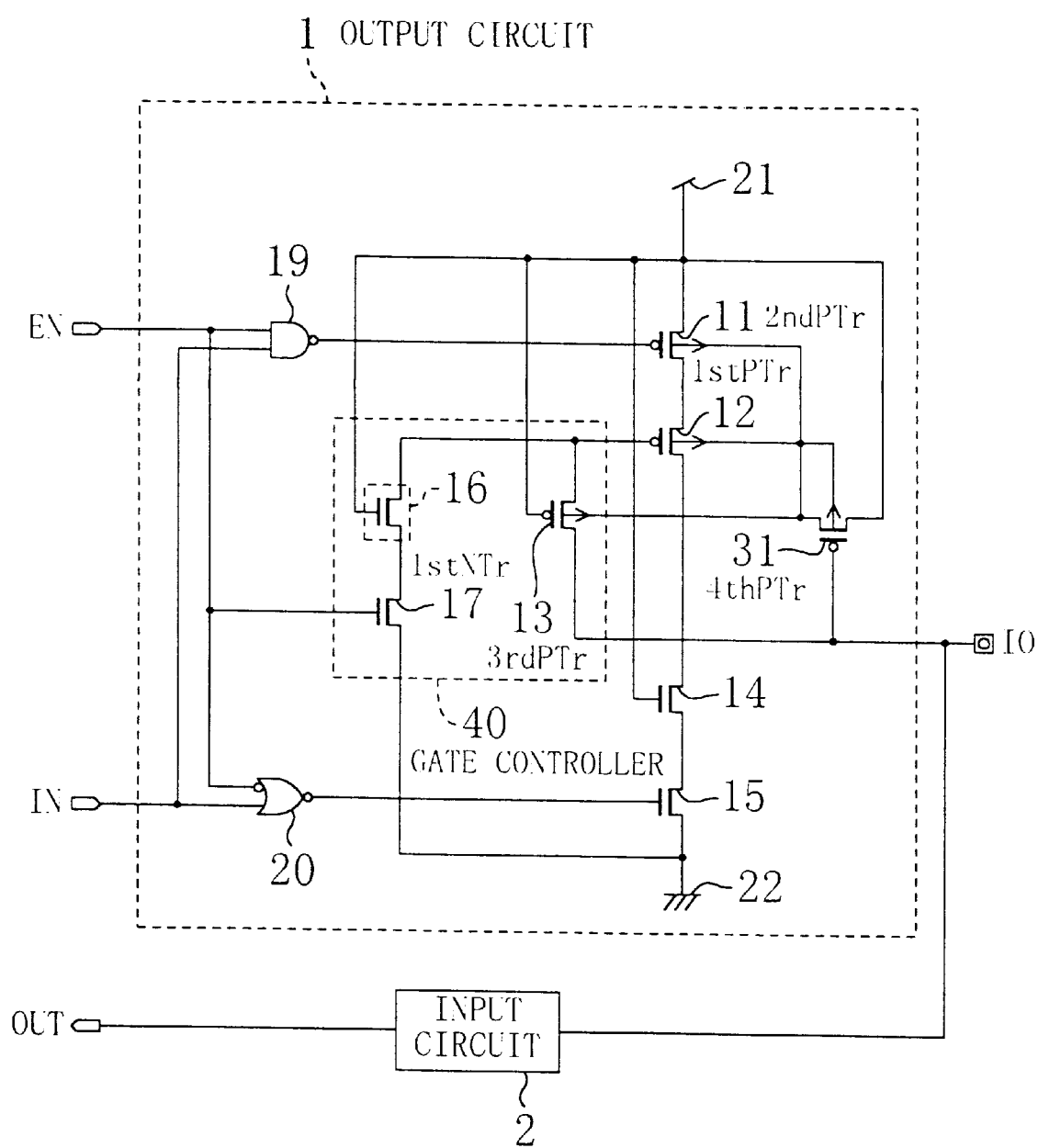
FIG. 1 is a circuit diagram illustrating a configuration of an input/output circuit according to the first embodiment of the present invention.

FIG. 1 illustrates a circuit configuration of the input/output circuit according to the first embodiment of the present invention.

The feature of the present invention consists in the configuration of the output circuit section in the input/output circuit. Accordingly, the internal configuration of the input circuit section, which is another main component of the input/output circuit, will not be described in detail.

As shown in FIG. 1, the input/output circuit includes: an input/output terminal IO; an input terminal IN; an output terminal OUT; an enable terminal EN; an output circuit 1; and an input circuit 2. The input/output terminal IO is used for exchanging signals with external circuits outside of an LSI. At the input terminal IN, signals are received from other circuits inside the LSI. Conversely, through the output terminal OUT, signals are output to other circuits inside the LSI. And the enable terminal EN is used for switching the output/input states of the input/output terminal IO.

In the output circuit 1, if the enable terminal EN is at "H" level, a signal, received at the input terminal IN, is output through the input/output terminal IO. Conversely, if the enable terminal EN is at "L" level, the input/output terminal IO has high impedance.

The output circuit 1 includes: first, second, third and fourth PMOS transistors 12, 11, 13 and 31; NMOS transistors 14, 15, 16 and 17; a NAND circuit 19; a NOR circuit 20; a power supply terminal 21; and a ground terminal 22. It should be noted that the NMOS transistor 17 is equivalent to the first NMOS transistor in the appended claims. In this output circuit, the third PMOS transistor 13 and the pair of NMOS transistors 16 and 17 constitute a gate controller 40 for controlling a gate voltage at the first PMOS transistor 12. The NMOS transistor 16 is used as a step-down transformer.

The first and second PMOS transistors 12 and 11 are serially connected between the power supply terminal 21 and the input/output terminal IO. The pair of NMOS transistors 14 and 15 are serially connected between the ground terminal 22 and the input/output terminal IO. The output of the NAND circuit 19 is supplied to the gate of the second PMOS transistor 11. One of the input terminals of the NAND circuit 19 is connected to the enable terminal EN, while the other terminal thereof is connected to the input terminal IN. The output of the NOR circuit 20 is supplied to the gate of the NMOS transistor 15. One of the input terminals of the NOR circuit 20 receives an inverted signal of the signal received at the enable terminal EN, while the other terminal thereof is connected to the input terminal IN. The gate of the first PMOS transistor 12 is connected to the ground terminal 22 via the pair of NMOS transistors 16 and 17 that are serially connected to each other, and also connected to the input/output terminal IO via the third PMOS transistor 13.

The respective gates of the third PMOS transistor 13 and the NMOS transistors 14 and 16 are connected to the power supply terminal 21. The gate of the first NMOS transistor 17 is connected to the enable terminal EN.

The substrates of the first through fourth PMOS transistors 12, 11, 13 and 31 are connected to the power supply terminal 21 via the fourth PMOS transistor 31, the gate of which is connected to the input/output terminal IO.

It should be noted that the substrate of the second PMOS transistor 11 is not necessarily connected in common to the substrate of the first PMOS transistor 12. However, if these substrates are connected in common, the total area of the circuit expected during designing can be advantageously reduced.

As described above, the respective gates of the NMOS transistors 14 and 16 are connected to the power supply terminal 21. Accordingly, even if a voltage higher than the power supply voltage is applied to one terminal of the NMOS transistor 14 or 16, the other terminal thereof receives only a difference obtained by subtracting the threshold voltage thereof from the gate voltage thereof. Thus, the NMOS transistors 14 and 16 function as step-down transformers.

The input circuit 2 transmits a signal, received at the input/output terminal IO, to other circuits inside the LSI through the output terminal OUT.

The operation of the input/output circuit having such a configuration, especially that of the output circuit 1, will be described.

First, an operation of outputting a signal, received at the input terminal IN from other internal circuits, through the input/output terminal IO via the output circuit 1 will be described.

In outputting a signal through the input/output terminal IO, the enable terminal EN should be at "H" level. If the signal at the input terminal IN is at "H" level, the respective outputs of the NAND and NOR circuits 19 and 20 are both at "L" level. Since the respective gates of the third PMOS transistor 13 and the NMOS transistors 14 and 16 are connected to the power supply terminal 21, an "H" level signal is supplied to these gates. Accordingly, the third PMOS transistor 13 turns OFF, while the NMOS transistors 14 and 16 turn ON. In this case, the respective gates of the second PMOS transistor 11 and the NMOS transistor 15 are both at "L" level. Accordingly, the second PMOS transistor 11 turns ON, while the NMOS transistor 15 turns OFF. On the other hand, the gate of the first NMOS transistor 17 is at "H" level, the first NMOS transistor 17 turns ON. Since the NMOS transistors 16 and 17 are ON, the gate of the first PMOS transistor 12 is at "L" level to turn ON the transistor 12.

Accordingly, since the first and second PMOS transistors 12 and 11 and the NMOS transistor 14 are ON and the NMOS transistor 15 is OFF, an "H" level signal is output from the power supply terminal 21 to the input/output terminal 21.

In this case, since the gate of the fourth PMOS transistor 31 is at "H" level, the fourth PMOS transistor 31 turns OFF, and the substrates of the first through fourth PMOS transistors 12, 11, 13 and 31 are floating. In such a case, a parasitic diode is formed between the drain diffused layer and the substrate in each of the PMOS transistors 11, 12 and 31. Accordingly, the potential in the substrate is obtained by subtracting a built-in voltage (about 0.7 V) of the diode from the power supply voltage. Thus, if the power supply voltage is 3.3 V, then the substrate potential is about 2.6 V.

Next, the operation of the output circuit 1 while the signal received at the input terminal IN is at "L" level will be described. In such a case, an "H" level signal is received at the enable terminal EN.

If the input terminal IN is at "L" level, the respective outputs of the NAND and NOR circuits 19 and 20 are both at "H" level. In this case, since the NMOS transistors 16 and 17 are both ON, the "L" level signal is supplied from the ground terminal 22 to the gate of the first PMOS transistor 12. Accordingly, the first PMOS transistor 12 turns ON. On the other hand, since the "H" level signal is supplied from the NAND circuit 19 to the gate of the second PMOS transistor 11, the second PMOS transistor 11 turns OFF. As a result, a current path from the power supply terminal 21 to the input/output terminal IO is blocked.

Also, since the NMOS transistors 14 and 15 are both ON, the "L" level signal is supplied from the ground terminal 22 to the input/output terminal IO.

In this case, since the gate of the fourth PMOS transistor 31 is at "L" level, the fourth PMOS transistor 31 turns ON. Accordingly, the potential in the substrates of the first through fourth PMOS transistors 12, 11, 13 and 31 is equal to the power supply voltage (3.3 V).

Next, the operation of inputting a signal, received at the input/output terminal IO, to other internal circuits through the output terminal OUT of the input circuit 2 will be described.

In this case, the "L" level signal is supplied to the enable terminal EN, thereby making the output circuit 1 have high impedance with respect to the input/output terminal IO.

The operation of the output circuit 1 in such a situation will be described in greater detail below.

If the enable terminal EN is at "L"0 level, then the output of the NAND circuit 19 is at "H" level, while the output of the NOR circuit 20 is at "L" level. The "H" and "L" level signals are supplied to the gates of the second PMOS transistor 11 and NMOS transistor 15, respectively. As a result, these transistors 11 and 15 are both turned OFF. The third PMOS transistor 13, the gate of which is connected to the power supply terminal 21, is also OFF. Accordingly, no current path is available from the input/output terminal IO, and the output circuit 1 has high impedance. If a signal is received at the input/output terminal IO in such a state, then the signal is passed through the input circuit 2 and output through the output terminal OUT to other internal circuits.

Suppose a signal with a voltage (e.g., 5 V) higher than the power supply voltage (e.g., 3.3 V) is received at the input/output terminal IO. In such a case, since a voltage at one terminal (i.e., 5 V) of the third PMOS transistor 13 is higher than the gate voltage thereof (i.e., 3.3 V), the third PMOS transistor 13 turns ON. And the input signal (5 V) is transmitted to the gate of the first PMOS transistor 12. In response to this signal, the gate voltage of the first PMOS transistor 12 increases to 5 V, and the PMOS transistor 12 turns OFF. Accordingly, the current path from the input/output terminal IO to the power supply terminal 21 is blocked. 5 V is also applied to the NMOS transistor 16. However, only a voltage obtained by subtracting the threshold voltage of the NMOS transistor 16 (defined at 1 V considering back bias effect) from the gate voltage thereof (3.3 V), i.e., 2.3 V, is transmitted to the first NMOS transistor 17. And since the NMOS transistor 17 is OFF, the signal received at the input/output terminal IO is not supplied to the ground terminal 22 via the third PMOS transistor 13 and the NMOS transistors 16 and 17. Since the NMOS transistor 15 is also OFF, no current flows from the input/output terminal IO into the ground terminal 22 via the NMOS transistors 14 and 15, either.

Furthermore, although 5 V is applied to one terminal of the NMOS transistor 14 and to one terminal of the NMOS transistor 16, only a potential difference between 5 and 3.3 V, i.e., 1.7 V, is applied to the gate oxide film thereof, because the gate voltage thereof is 3.3 V. Accordingly, no breakdown happens in the gate oxide film. Similarly, although 5 V is applied to both terminals of the third PMOS transistor 13, only a potential difference between 5 and 3.3 V, i.e., 1.7 V, is applied to the gate oxide film thereof, because the gate voltage thereof is 3.3 V. Thus, no breakdown happens in the gate oxide film, either. Although 5 V is applied to the gate of the first PMOS transistor 12, the voltage at the gate oxide film thereof is also 1.7 V, because one terminal of the PMOS transistor 12 receives 5 V and the other terminal thereof receives 3.3 V. The voltage at the other terminal of the NMOS transistor 14 is a voltage obtained by subtracting the threshold voltage of the NMOS transistor 14 (defined at 1 V considering back bias effect) from the gate voltage thereof (3.3 V), i.e., 2.3 V. Accordingly, this voltage does not have harmful effect on the NMOS transistor 15. Also, a parasitic diode is formed between the drain diffused layer and the substrate in each of the PMOS transistors 11 and 31. Accordingly, the potential in the substrates of the first through fourth PMOS transistors 12, 11, 13 and 31 is obtained by subtracting a built-in voltage (about 0.7 V) of the diode from the voltage (5 V) at the input/output terminal IO, i.e., about 4.3 V.

In this configuration, when a signal is output through the input/output terminal IO, the first PMOS transistor 12 is always ON. And a signal, received at the input terminal IN, is output through the input/output terminal IO via the NAND circuit 19 and the second and first PMOS transistors 11 and 12. Accordingly, a delay between the input of a signal to the input terminal IN and the output thereof from the input/output terminal IO can be shortened as compared with a conventional output circuit.

Also, since only the second PMOS transistor 11 should be driven with the signal supplied from the NAND circuit 19, the size of the transistor constituting the NAND circuit 19 need not be so large, thus contributing to increasing the number of devices integrated within a single LSI. Moreover, since the load driven by the NAND circuit 19 and the transistor size of the NAND circuit 19 itself are small, the power dissipation can also be advantageously reduced.

It is noted that if the breakdown voltage of each of the transistors constituting the LSI is 5 V and only the power supply voltage is 3.3 V, then the NMOS transistors 14 and 16 need not be provided.

The substrates of the first through third PMOS transistors 12, 11 and 13 may be connected to the input/output terminal IO as in the prior art. In the prior art example described above, the substrate potential may be variable within the range from 0 V to 5 V. In contrast, if these substrates are connected to the power supply terminal 21 via the fourth PMOS transistor 31 as in this embodiment, then the substrate potential is variable within a narrower range from 3.3 V to 5 V. Consequently, the power consumption can be reduced.

Embodiment 2

Figure 2:
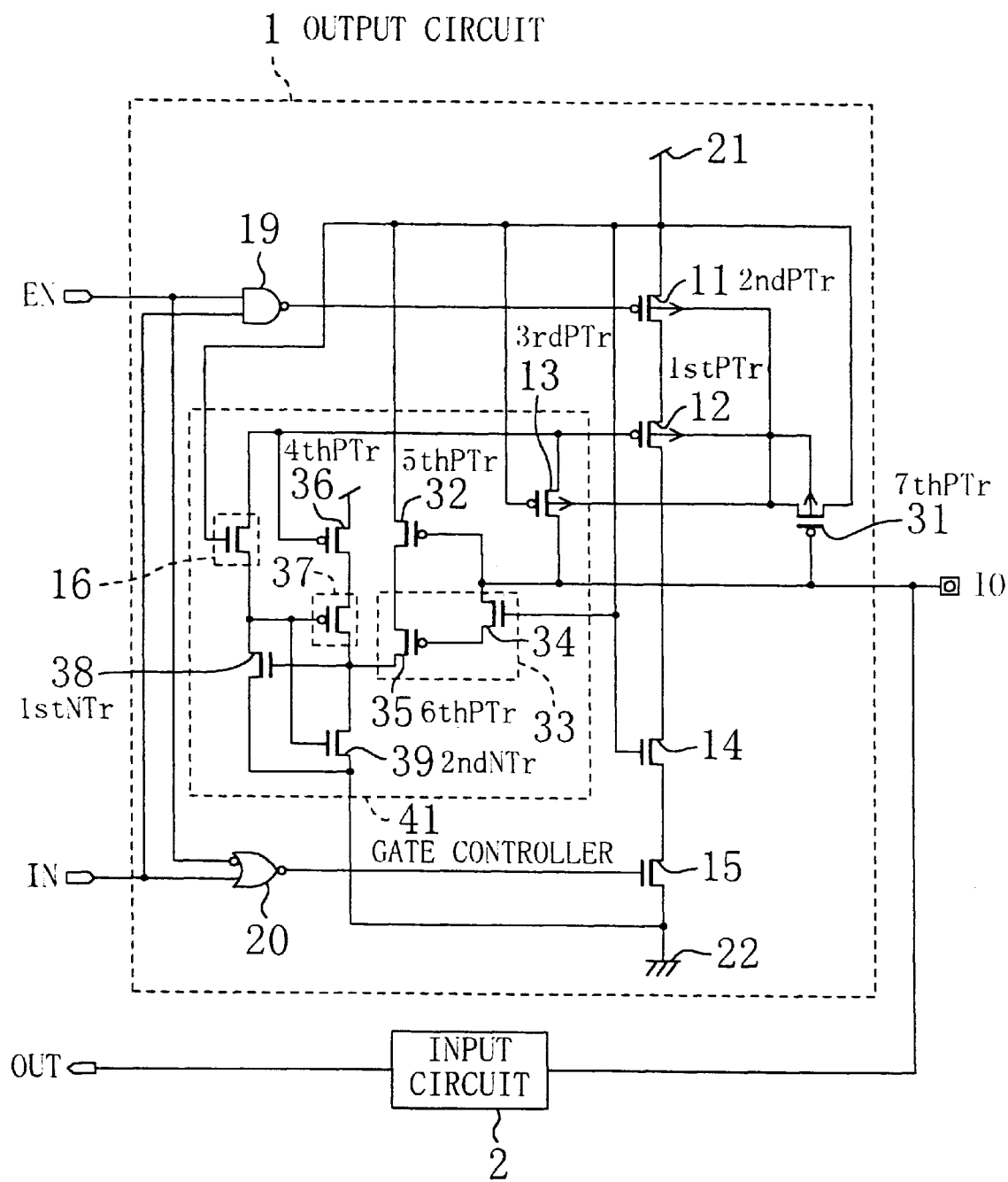
FIG. 2 is a circuit diagram illustrating a configuration of an input/output circuit according to the second embodiment of the present invention.
Figure 3:
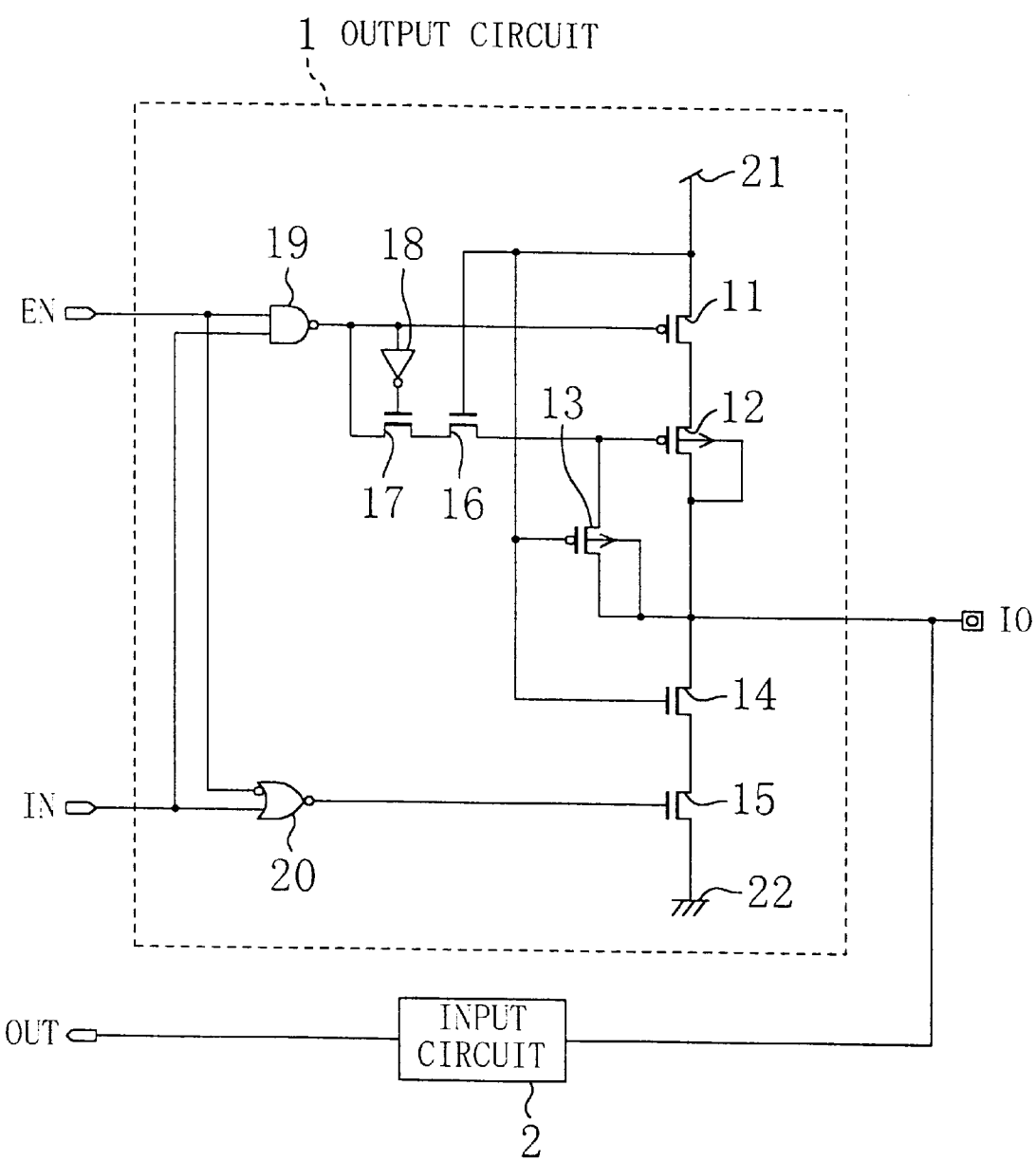
FIG. 3 is a circuit diagram illustrating a configuration of a prior art input/output circuit.

FIG. 2 illustrates a circuit configuration of an input/output circuit according to the second embodiment of the present invention.

The same components as those used in the first embodiment illustrated in FIG. 1 are identified by the same reference numerals.

As shown in FIG. 2, the input/output circuit also includes: an input/output terminal IO; an input terminal IN; an output terminal OUT; an enable terminal EN; an output circuit 1; and an input circuit 2. The output circuit 1 includes: first through eighth PMOS transistors 12, 11, 13, 36, 32, 35, 31 and 37; NMOS transistors 14, 15, 16, 34, 38 and 39; a NAND circuit 19; a NOR circuit 20; a power supply terminal 21; and a ground terminal 22. It should be noted that the NMOS transistors 38 and 39 are equivalent to the first and second NMOS transistor, respectively, in the appended claims. In this output circuit, the NMOS transistor 16 and the eighth PMOS transistor 37 are used as first and second step-down transformers, respectively. The NMOS transistor 34 and the sixth PMOS transistor 35 constitute a third step-down transformer 33. The NMOS transistor 34 is equivalent to the circuit section for reducing a voltage as defined in the claims. The third through sixth and eighth PMOS transistors 13, 36, 32, 35 and 37, the first and second NMOS transistors 38 and 39 and the NMOS transistor 34 constitute a gate controller 41 for controlling a gate voltage at the first PMOS transistor 12.

The gate of the fifth PMOS transistor 32 is connected to the input/output terminal IO. One of the terminals of the transistor 32 is connected to the power supply terminal 21. And the other terminal of the transistor 32 is connected to the gate of the first NMOS transistor 38, one terminal of the eighth PMOS transistor 37 and one terminal of the second NMOS transistor 39 via the sixth PMOS transistor 35. The gate of the fifth PMOS transistor 32 is also connected to the gate of the sixth PMOS transistor 35 via the NMOS transistor 34. The gate of the NMOS transistor 34 is connected to the power supply terminal 21. The gates of the eighth PMOS transistor 37 and the second NMOS transistor 39 are connected to each other and to an intermediate node between the NMOS transistors 16 and 38. The other terminal of the eighth PMOS transistor 37 is connected to the power supply terminal 21 via the fourth PMOS transistor 36. And the gate of the fourth PMOS transistor 36 is connected to an intermediate node between the NMOS transistor 16 and the third PMOS transistor 13. The respective other terminals of the first and second NMOS transistors 38 and 39 are connected to the ground terminal 22.

In the first embodiment, the gate of the first PMOS transistor 12 is controlled with a potential at the input/output terminal IO and a signal at the enable terminal EN. In contrast, in the second embodiment, the gate of the first PMOS transistor 12 is controlled with only the potential at the input/output terminal IO.

The operation of the input/output circuit having such a configuration will be described in terms of the operation of the output circuit 1, in particular.

First, in the initial state where the power supply voltage is applied for the first time, a voltage at the input/output terminal IO is usually 0 V. In this case, since he gate of the NMOS transistor 34 is connected to the power supply terminal 21, the NMOS transistor 34 turns ON. And 0 V is applied from the input/output terminal IO to the respective gates of the fifth and sixth PMOS transistors 32 and 35, these transistors 32 and 35 also turn ON. Since the "H" level signal is subsequently supplied to the gate of the first NMOS transistor 38 via the fifth and sixth PMOS transistors 32 and 35, the first NMOS transistor 38 turns ON. Also, since the gate of the NMOS transistor 16 is connected to the power supply terminal 21 (3.3 V), the NMOS transistor 16 turns ON, too. Accordingly, respective gate voltages at the first, fourth and eighth PMOS transistors 12, 36 and 37 and the second NMOS transistor 39 are all 0 V. Thus, these PMOS transistors 12, 36 and 37 turn ON, but the NMOS transistor 39 turns OFF. As a result, a gate voltage at the first NMOS transistor 38 is stabilized at 3.3 V.

Also, the first PMOS transistor 12 and the NMOS transistor 14 are both ON. Accordingly, in outputting an "H" level signal through the input/output terminal IO, the enable terminal EN and the input terminal IN both should be at "H" level. In such a case, since the respective outputs of the NAND and NOR circuits 19 and 20 are both at "L" level, the second PMOS transistor 11 turns ON and the NMOS transistor 15 turns OFF. As a result, the "H" level signal is output through the input/output terminal IO.

Conversely, in outputting an "L" level signal through the input/output terminal IO, the enable terminal EN should be at "H" level, while the input terminal IN should be at "L" level. In such a case, since the respective outputs of the NAND and NOR circuits 19 and 20 are both at "H" level, the second PMOS transistor 11 turns OFF and the NMOS transistor 15 turns ON. As a result, the "L" level signal is output through the input/output terminal IO.

On the other hand, in inputting a signal to other circuits through the input/output terminal IO, the enable terminal EN should be at "L" level, thereby making the output circuit 1 have high impedance. If the enable terminal EN is at "L" level, then the output of the NAND circuit 19 is at "H" level, while the output of the NOR circuit 20 is at "L" level. The "H" and "L" level signals are supplied to the gates of the second PMOS transistor 11 and NMOS transistor 15, respectively. As a result, these transistors 11 and 15 both turn OFF. Accordingly, no current path is available from the input/output terminal IO, and the output circuit 1 comes to have high impedance. If a signal, received at the input/output terminal IO, is input to other internal circuits in such a state, then the signal is passed through the input circuit 2 and output through the output terminal OUT to the internal circuits.

Suppose a signal with a voltage (e.g., 5 V) higher than the power supply voltage (e.g., 3.3 V) is received at the input/output terminal IO. In such a case, since a voltage at one of the terminals (i.e., 5 V) of the third PMOS transistor 13 is higher than the gate voltage thereof (i.e., 3.3 V), the third PMOS transistor 13 turns ON. And the input signal (5 V) is transmitted to the gate of the first PMOS transistor 12. In response to this signal, the gate voltage at the first PMOS transistor 12 increases to 5 V to turn the PMOS transistor 12 OFF. Accordingly, the current path from the input/output terminal IO to the power supply terminal 21 is blocked.

5 V is also applied to the NMOS transistor 16. However, a gate voltage at the NMOS transistor is 3.3 V. Thus, only a voltage obtained by subtracting the threshold voltage of the NMOS transistor 16 (defined at 1 V considering back bias effect) from the gate voltage thereof (3.3 V), i.e., 2.3 V, is applied to one terminal of the first NMOS transistor 38, the gate of the eighth PMOS transistor 37 and the gate of the second NMOS transistor 39. Accordingly, the second NMOS transistor 39 turns ON. Since the gate voltage at the fifth PMOS transistor 32 is 5 V, the transistor 32 is OFF. As the fifth and fourth PMOS transistors 32 and 36 are OFF and the second NMOS transistor 39 is ON, the gate voltage at the first NMOS transistor 38 is 0 V and the transistor 38 turns OFF. Thus, the current, which has flowed from the input/output terminal IO through the third PMOS transistor 13 and the NMOS transistor 16, is blocked by the first NMOS transistor 38. Although the gate voltage at the fifth PMOS transistor 32 is 5 V, the gate voltage at the sixth PMOS transistor 35 is also 2.3 V, because the PMOS transistor 35 is affected by the NMOS transistor 34. Accordingly, a voltage at one terminal of the fifth PMOS transistor 32 decreases to no lower than a voltage obtained by adding the threshold voltage of the sixth PMOS transistor 35 to 2.3 V (if the threshold voltage of the transistor 35 is 0.6 V, for example, then 2.9 V). Accordingly, a voltage in the gate oxide film of the PMOS transistor 32 is as low as 2.1 V.

Should the voltage at the input/output terminal be 3.3 V in the initial state where the power supply voltage is applied for the first time, the output circuit 1 is in unstable state, because the fifth PMOS transistor 32 is OFF. In such a case, if an "L" level signal is output through the input/output terminal IO or if a pull-up resistor having a high resistance is inserted into the gate of the first NMOS transistor 38, then such unstable state can be eliminated.

In this configuration, whenever a signal is output through the input/output terminal IO to external circuits, the first PMOS transistor 12 is ON. And a signal, received at the input terminal IN, is output through the input/output terminal IO via the NAND circuit 19 and the second and first PMOS transistors 11 and 12. Accordingly, a delay between the input of a signal to the input terminal IN and the output thereof from the input/output terminal IO can be shortened as compared with a conventional output circuit.

Also, since only the second PMOS transistor 11 should be driven by the NAND circuit 19, the transistor size of the NAND circuit 19 does not have to be so large, thus contributing to increasing the number of devices integrated within a single LSI. Moreover, since the load driven by the NAND circuit 19 and the transistor size of the NAND circuit 19 itself are small, the power dissipation can also be advantageously reduced.

Furthermore, the following effect, unattainable by the first embodiment, can be attained in this embodiment. In the first embodiment, as long as the enable terminal EN is at "H" level, the first NMOS transistor 17 is ON. Accordingly, if a signal with a voltage higher than the power supply voltage is applied to the input/output terminal IO, then a current path, running from the input/output terminal IO through the third PMOS transistor 13 and the NMOS transistors 16 and 17 to the ground terminal 22, is formed. As a result, unnecessary current flows. In contrast, even while the voltage at the enable terminal EN is at "H" level, if a signal with a voltage exceeding the power supply voltage is applied to the input/output terminal IO, then the first NMOS transistor 38 turns OFF in the gate controller 41 in this embodiment. Thus, a current path, running from the input/output terminal IO through the third PMOS transistor 13 and the NMOS transistors 16 and 38 to the ground terminal 22, is blocked, resulting in no unnecessary current. Accordingly, in this embodiment, a signal, having a voltage higher than the power supply voltage, may be received without using the enable signal. Therefore, even an output circuit 1, which cannot have high impedance because the circuit does not include the enable terminal EN, can be protected if a voltage higher than the power supply voltage has been applied thereto.

It is noted that if the breakdown voltage of each of the transistors constituting the output circuit 1 is 5 V and only the power supply voltage is 3.3 V, then the NMOS transistors 14, 16 and 34 and the sixth and fourth PMOS transistors 35 and 36 need not be provided.

The substrates of the first through third PMOS transistors 12, 11 and 13 may be connected to the input/output terminal IO as in the prior art. In the prior art example described above, the substrate potential may be variable within the range from 0 V to 5 V. In contrast, if these substrates are connected to the power supply terminal 21 via the seventh PMOS transistor 31 as in this embodiment, then the substrate potential is variable within a narrower range from 3.3 V to 5 V. Accordingly, the power consumption can be reduced.

In the foregoing embodiments, the first and third step-down transformers are implemented as respective n-channel MOS transistors 16 and 34 receiving a power supply voltage at the gate thereof. And in the second embodiment, the second step-down transformer is implemented as the eighth p-channel MOS transistor 37 receiving a voltage equal to or lower than the power supply voltage at the gate thereof.

Figure 4A:
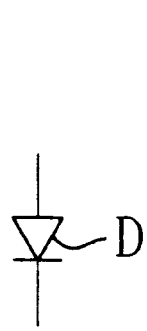
FIGS. 4(a) through 4(d) are diagrams illustrating various modifications of a step-down transformer for the input/output circuit according to the first or second embodiment of the present invention.
Figure 4B:
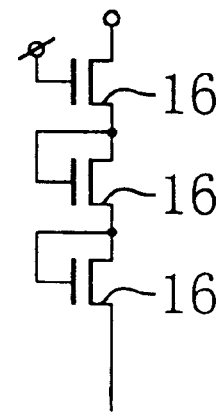
Figure 4C:
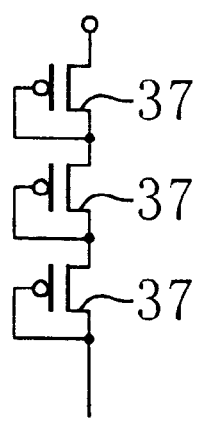
Figure 4D:
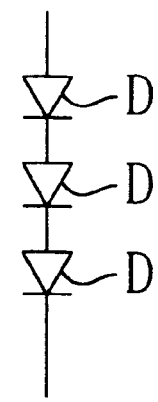

Alternatively, each of these step-down transformers may be naturally implemented as a diode D as shown in FIG. 4(a) or a circuit formed by serially connecting a plurality of n-channel MOS transistors 16, p-channel MOS transistors 37 or diodes D as shown in FIGS. 4(b), 4(c) and 4(d), respectively.

What is claimed is:

1. An output circuit comprising:
   an input/output terminal;
   a first p-channel MOS transistor, one terminal of which is connected to the input/output terminal;
   a second p-channel MOS transistor serially connected to the other terminal of the first p-channel MOS transistor; and
   a gate controller, connected to the input/output terminal, for controlling a gate voltage at the first p-channel MOS transistor,
   wherein a signal is input to the gate of the second p-channel MOS transistor, and
   wherein a signal is output through the input/output terminal in response to the input signal, and
   wherein the gate controller turns ON the first p-channel MOS transistor by setting a gate voltage at the first p-channel MOS transistor lower than a power supply voltage if a voltage at the input/output terminal is equal to or lower than a power supply voltage, and
   wherein the gate controller turns OFF the first p-channel MOS transistor by connecting the gate of the first p-channel MOS transistor to the input/output terminal if the voltage at the input/output terminal is higher than the power supply voltage,
   wherein the gate controller includes third and fourth p-channel MOS transistors and first and second n-channel MOS transistors, and
   wherein one terminal of the third p-channel MOS transistor, one terminal of the first n-channel MOS transistor and the gate of the second n-channel MOS transistor are connected to the gate of the first p-channel MOS transistor, and
   wherein one terminal of the fourth p-channel MOS transistor is connected to the gate of the first n-channel MOS transistor and one terminal of the second n-channel MOS transistor, and a voltage at the other terminal of the fourth p-channel MOS transistor is the power supply voltage, and
   wherein a gate voltage at the third p-channel MOS transistor is the power supply voltage, one terminal of the third p-channel MOS transistor is connected to the gate of the fourth p-channel MOS transistor, and the other terminal of the third p-channel MOS transistor is connected to the input/output terminal.

2. The output circuit of claim 1, wherein the gate controller further includes a fifth p-channel MOS transistor, and
   wherein the gate of the fifth p-channel MOS transistor is connected to the input/output terminal, one terminal of the fifth p-channel MOS transistor is connected to the one terminal of the second n-channel MOS transistor and a voltage at the other terminal of the fifth p-channel MOS transistor is the power supply voltage.

3. The output circuit of claim 1, wherein the gate controller includes first and second step-down transformers, and
   wherein the first step-down transformer is disposed between the gate of the first p-channel MOS transistor and the one terminal of the first n-channel MOS transistor, and
   wherein the second step-down transformer is disposed between one terminal of the fourth p-channel MOS transistor and a node at which the gate of the first n-channel MOS transistor is connected to the one terminal of the second n-channel MOS transistor.

4. The output circuit of claim 3, wherein the gate controller includes a third step-down transformer, and
   wherein the third step-down transformer includes a circuit section for reducing a voltage and a sixth p-channel MOS transistor, and
   wherein one terminal of the sixth p-channel MOS transistor is connected to the one terminal of the fifth p-channel MOS transistor, the other terminal of the sixth p-channel MOS transistor is connected to the node at which the gate of the first n-channel MOS transistor is connected to the one terminal of the second n-channel MOS transistor, and the gate of the sixth p-channel MOS transistor is connected to the input/output terminal via the circuit section for reducing a voltage.

5. The output circuit of claim 1, further comprising a seventh p-channel MOS transistor, and
   wherein a voltage at one terminal of the seventh p-channel MOS transistor is the power supply voltage, the other terminal of the seventh p-channel MOS transistor is connected to substrates of the first, second and third p-channel MOS transistors, and the gate of the seventh p-channel MOS transistor is connected to the input/output terminal.

6. The output circuit of claim 3, wherein the first step-down transformer is implemented as: an n-channel MOS transistor receiving the power supply voltage at the gate thereof; a p-channel MOS transistor receiving a voltage equal to or lower than the power supply voltage at the gate thereof; a diode; or a circuit obtained by serially connecting the n- or p-channel MOS transistors or the diodes to each other.

7. The output circuit of claim 3, wherein the second step-down transformer is implemented as: an n-channel MOS transistor receiving the power supply voltage at the gate thereof; a p-channel MOS transistor receiving a voltage equal to or lower than the power supply voltage at the gate thereof; a diode; or a circuit obtained by serially connecting the n- or p-channel MOS transistors or the diodes to each other.

8. The output circuit of claim 4, wherein the third step-down transformer is implemented as: an n-channel MOS transistor receiving the power supply voltage at the gate thereof; a p-channel MOS transistor receiving a voltage equal to or lower than the power supply voltage at the gate thereof; a diode; or a circuit obtained by serially connecting the n- or p-channel MOS transistors or the diodes to each other.

9. The output circuit of claim 2, wherein the gate controller includes first and second step-down transformers, and
   wherein the first step-down transformer is disposed between the gate of the first p-channel MOS transistor and the one terminal of the first n-channel MOS transistor, and
   wherein the second step-down transformer is disposed between one terminal of the fourth p-channel MOS transistor and a node at which the gate of the first n-channel MOS transistor is connected to the one terminal of the second n-channel MOS transistor.

10. The output circuit of claim 4, wherein the first step-down transformer is implemented as: an n-channel MOS transistor receiving the power supply voltage at the gate thereof; a p-channel MOS transistor receiving a voltage equal to or lower than the power supply voltage at the gate thereof a diode; or a circuit obtained by serially connecting the nor p-channel MOS transistors or the diodes to each other.

11. The output circuit of claim 4, wherein the second step-down transformer is implemented as: an n-channel MOS transistor receiving the power supply voltage at the gate thereof, a p-channel MOS transistor receiving a voltage equal to or lower than the power supply voltage at the gate thereof; a diode; or a circuit obtained by serially connecting the nor p-channel MOS transistors or the diodes to each other.

12. The output circuit of claim 9, wherein the gate controller includes a third step-down transformer, and wherein the third step-down transformer includes a circuit section for reducing a voltage and a sixth p-channel MOS transistor, and wherein one terminal of the sixth p-channel MOS transistor is connected to the one terminal of the fifth p-channel MOS transistor, the other terminal of the sixth p-channel MOS transistor is connected to the node at which the gate of the first n-channel MOS transistor is connected to the one terminal of the second n-channel MOS transistor, and the gate of the sixth p-channel MOS transistor is connected to the input/ output terminal via the circuit section for reducing a voltage.

* * * * *

UNITED STATES PATENT AND TRADEMARK OFFICE
CERTIFICATE OF CORRECTION

| | | |
|---|---|---|
| PATENT NO. | : 6,236,235 B1 | Page 1 of 1 |
| DATED | : November 6, 2001 | |
| INVENTOR(S) | : Katsuya Arai et al. | |

It is certified that error appears in the above-identified patent and that said Letters Patent is hereby corrected as shown below:

<u>Column 15, claim 10,</u>
Line 5, "nor p-channel" should be -- n or p-channel --

<u>Column 15, claim 11,</u>
Line 13, "nor p-channel" should be -- n or p-channel --

Signed and Sealed this

Sixteenth Day of April, 2002

Attest:

JAMES E. ROGAN
*Attesting Officer*     *Director of the United States Patent and Trademark Office*